United States Patent [19]
Hawkins et al.

[11] Patent Number: 5,276,520
[45] Date of Patent: Jan. 4, 1994

[54] ENHANCING EXPOSURE LATITUDE OF IMAGE SENSORS

[75] Inventors: Gilbert A. Hawkins, Mendon; Eric G. Stevens, Rochester, both of N.Y.

[73] Assignee: Eastman Kodak Company, Rochester, N.Y.

[21] Appl. No.: 711,827

[22] Filed: Jun. 7, 1991

[51] Int. Cl.$^5$ .................. H04N 5/335; H04N 3/14
[52] U.S. Cl. .................. 358/213.19; 257/223; 257/230
[58] Field of Search .......... 358/213.19, 213.26, 358/213.13, 213.15, 213.18, 213.31; 357/24, 24; 257/223, 230, 231

[56] References Cited

U.S. PATENT DOCUMENTS

| | | | |
|---|---|---|---|
| 4,460,912 | 7/1984 | Takeshita et al. | 357/24 |
| 4,611,223 | 9/1986 | Hine et al. | 357/30 |
| 4,626,915 | 12/1986 | Takatsu | 358/213 |
| 4,984,047 | 1/1991 | Stevens | 357/30 |
| 5,130,774 | 7/1992 | Stevens et al. | 357/24 |

Primary Examiner—Joseph Mancuso
Assistant Examiner—Joseph Colaianni
Attorney, Agent, or Firm—Raymond L. Owens

[57] ABSTRACT

A frame transfer image sensor having a lateral overflow drain and a structure for controlling the charge transfer to the drain during charge collection to improve exposure latitude.

3 Claims, 5 Drawing Sheets

ENHANCING EXPOSURE LATITUDE OF IMAGE SENSORS

FIELD OF THE INVENTION

This invention relates to enhancing the exposure latitude of image sensors.

BACKGROUND ART

FIG. 1a schematically shows the general organization of a full frame image sensor having an array of photosensitive elements which serve also as vertical shift registers 26. Several of the photosensitive elements which are shown in FIG. 1 are identified as A, B, C, D, E, F, G, H and I. Elements A-D are in one vertical shift register and elements E-I are in adjacent shift register. The elements are arranged in columns and rows. Photo charge is integrated in each sensor element and, at a predetermined time, appropriate bias voltage pulse signals are applied to the gate electrodes causing the charge to transfer along vertical CCD shift register 26. Those skilled in the art will appreciate that the shift registers 26 conveniently can be constructed in two phase buried channel architecture. Each photosensitive element includes two electrodes, 26a and 26b (see FIG. 1c).

Each CCD shift register 26 will be under the control of a plurality of the electrodes 26a and 26b. When a potential is applied to an electrode, a deplete region is formed under that electrode. Consider, for example, a buried channel CCD shift register which is formed with a p-substrate covered with a silicon dioxide layer with an n-buried channel on which there has been deposited a row of closely spaced electrodes for operating a shift register 26. FIGS. 1a-c illustrate a conventional full frame CCD image sensor. If the two electrodes 26a and 26b each contain both a barrier and a storage region, then they provide one complete CCD stage of what we will call a true two phase CCD. Such a two phase CCD is also effective in a non-interlaced interline CCD image sensor. One the electrodes 26b is covered with an opaque shield or covering while the other 26a is exposed to actinic light and accumulated signal charge. (See FIG. 1b). Al or $WSi_3$ can be sputtered and patterned to form the shield.

The signal charge is shifted vertically down the shift registers, 26, a line at a time, into a horizontal shift register, 27 (see FIG. 1a). The pixel charge information is shifted to a buffer amplifier 28 where it is converted to an output voltage proportional to the pixel charge, and becomes available for off-chip signal processing, storage and/or display.

A desirable feature in image sensors, is antiblooming. Blooming results when an area of the image sensor receives an amount of illumination that generates signal charges in excess of the charge capacity of the photosensitive element of the vertical shift register. The excess charge spreads or "blooms" along the vertical shift register, thus contaminating the signal from other pixels. Blooming control is essential in applications wherein the light level is not controlled. A lateral overflow drain (LOD) is a commonly used technique for controlling antiblooming. See U.S. Pat. No. 4,460,912. Overflow drains have a problem in that they reduce exposure latitude. Typically, after the charge capacity of the photosensitive element is reached, further increases in exposure cannot be measured.

In U.S. Pat. No. 4,626,915 an MOS solid state image sensor is disclosed in which the combined action of a vertical overflow drain (VOD) and vertical readout transfer gate enhances exposure latitude. However, this method suffers from several disadvantages because overflow charge must be removed from the vertical readout. If the vertical registers are bit lines, their capacitance decreases the device voltage sensitivity to photocharge; where as if the vertical readout registers are CCD's, the time required to remove overflowed charge is too long, interferes with readout and overflow timing, and limits the amount of antiblooming achievable. Also, the device construction of the VOD technology is not simple, consisting of 4 alternate n and p layers. Further, the necessity of changing the voltage of the p well induces a general potential fluctuation in other regions of the device which may induce noise and which alters the spectral response of the sensor during integration. The use of a VOD limits the long wavelength sensitivity of the device and requires the device process depend on cell size.

SUMMARY OF THE INVENTION

The object of this invention is to provide a CCD which includes effective overflow drain blooming control and enhances exposure latitude of image sensors and without compromising the performance of vertical CCD readout.

This object is achieved in a frame transfer image sensor having a plurality of vertical CCDs each of which includes photosensitive elements having a plurality of electrodes with one of such electrodes being transferred and adjusted to pass incident light which causes charge to be collected in a storage region, the improvement comprising:

(a) a lateral overflow drain including a doped region spaced from the CCD channel;

(b) an overflow gate electrode disposed for applying an overflow potential between the doped region and the CCD channel to control charge transfer between the charge storage region and the drain; and (c) means for controlling the overflow potential applied to the overflow gate electrode for varying the charge storage capacity of the storage region during the time charge is being collected to improve exposure latitude.

The invention reduces or eliminates prior art difficulties by allowing overflow charge to be drawn off to regions other than the vertical readout lines, in a manner in which the charge capacity of the well can be varied precisely with time throughout integration.

BRIEF DESCRIPTION OF THE DRAWINGS

FIG. 1b is a cross sectional view of the electrode 26a shown in FIG. 1a;

FIG. 4a-d all show graphs which illustrate the operational features of this invention.

DESCRIPTION OF THE PREFERRED EMBODIMENT

Figure 1A:
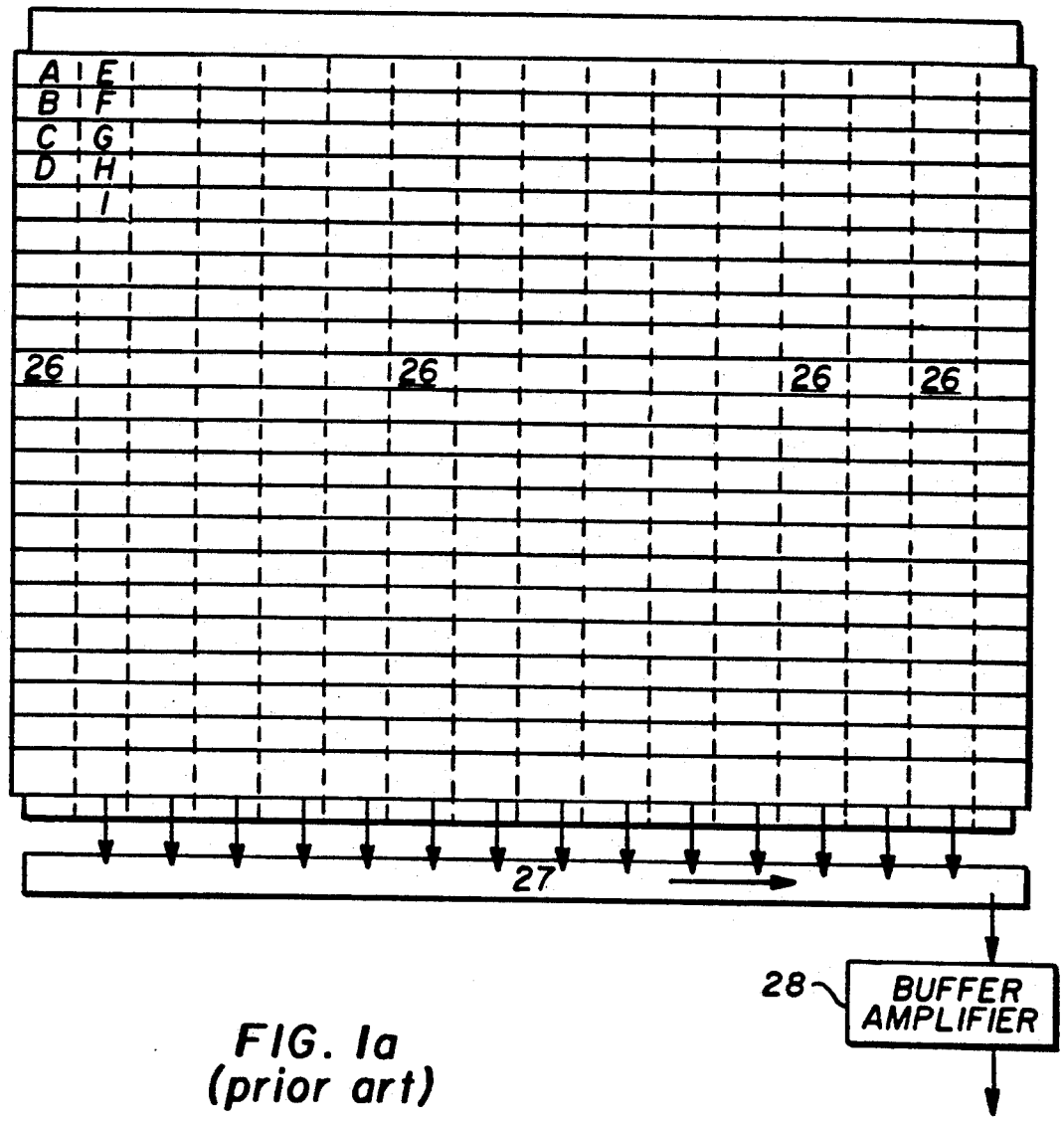
FIG. 1a is a schematic plan view of a conventional full frame area image sensor.
Figure 1B:
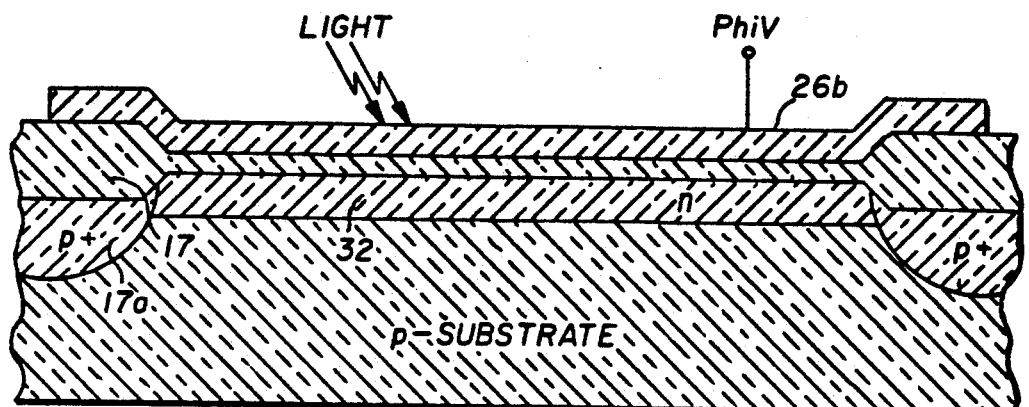
Figure 1C:
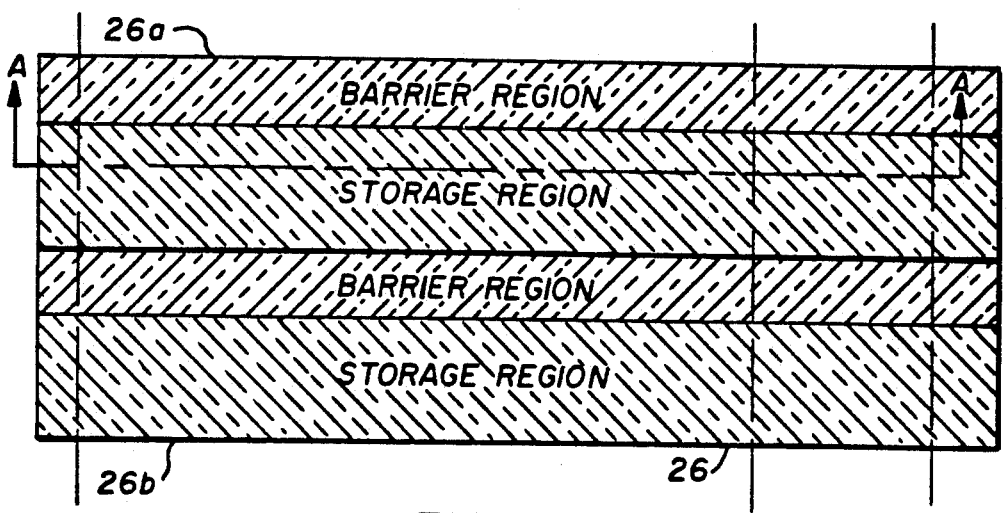
FIG. 1c is a plan view of a photosensitive element of FIG. 1.
Figure 1D:
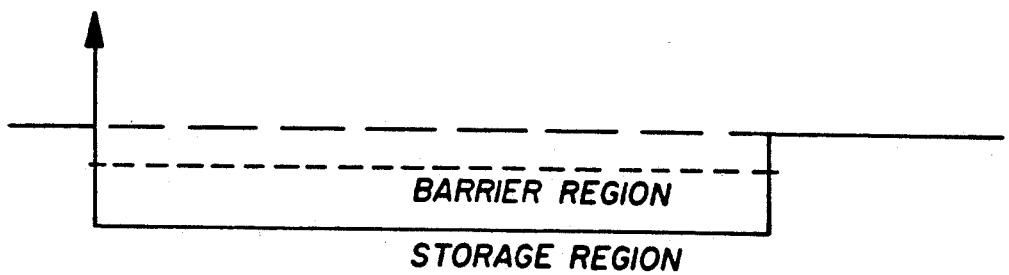
FIG. 1d shows an electrostatic potential diagram taken along line A—A of FIG. 1c.
Figure 2A:
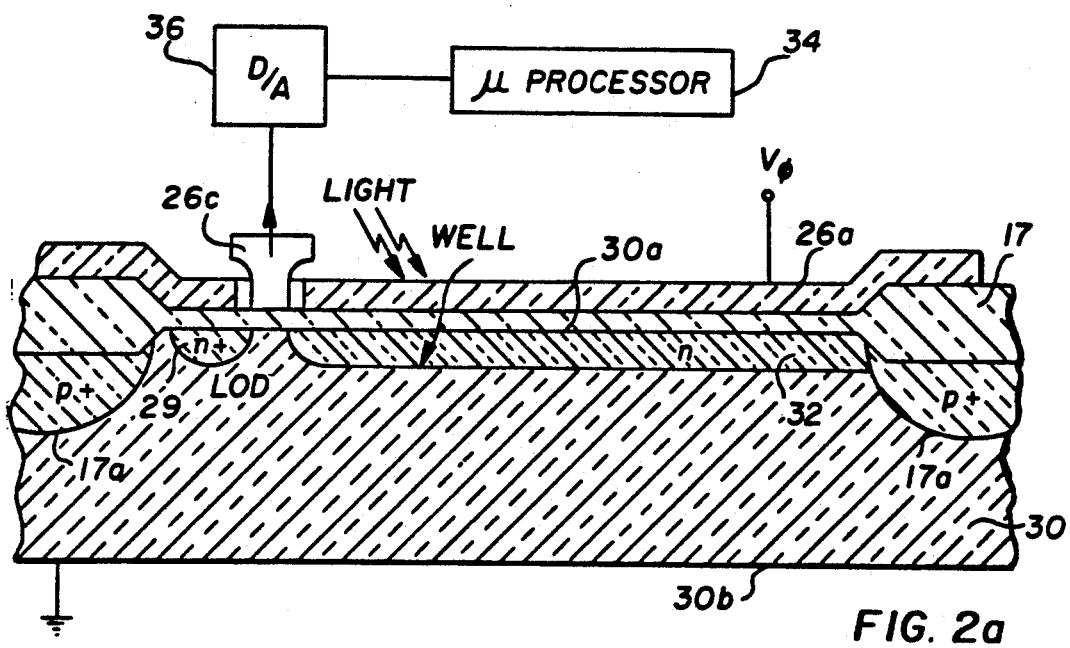
FIG. 2a is a sectional view of an image pixel taken along the line 2A—2A of FIG. 2b of an image sensor having a lateral overflow chain which can be used in accordance with the present invention.
Figure 2B:
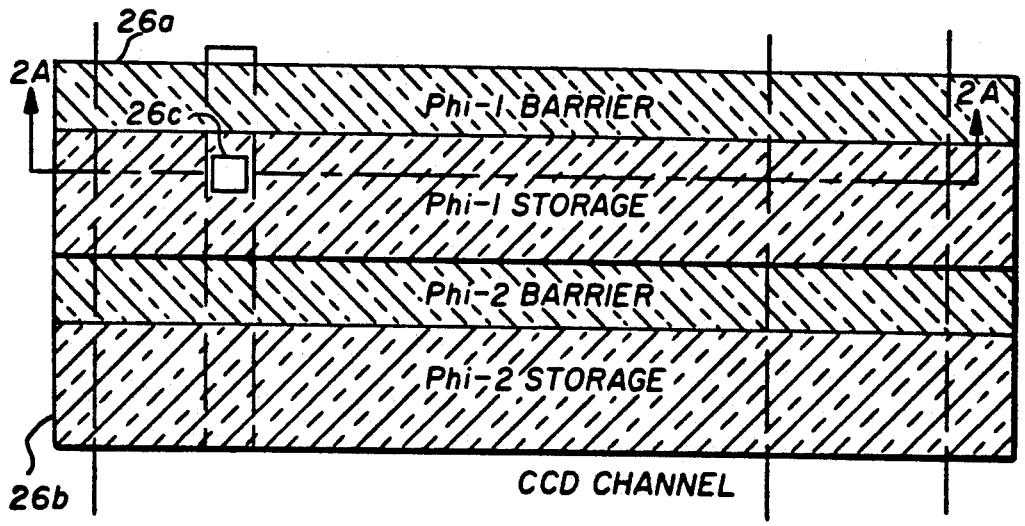
FIG. 2b is a plan view of an image sensor pixel which can be used in accordance with the present invention.

A single photosensitive pixel of a Full Frame CCD which can be used in accordance with this invention is shown in FIGS. 2a and 2b. Where elements correspond to those in FIGS. 1a-d, the same numerals will be used. A pixel is comprised of a photosensitive area which serves also as one stage of the vertical shift register, two predetermined polysilicon gate electrodes 26a and 26b under which are formed storage and barrier regions, a third polysilicon overflow gate electrode 26c which controls charge transfer from the storage areas under electrode 26a to a lateral overflow drain 29 (electrons). There is an opaque shield over electrode 26b. Actinic light passes through electrode 26a and charge is collected in channel 32 under the storage region. The lateral overflow drain (LOD) 29 is an $n^+$ doped region which carries away said overflow charge (electrons) during antiblooming operations. Such a LOD structure is well known in the art. The electrode 26c controls the potential in the substrate 30 between channel 32 and drain 29.

As shown in FIG. 2a, a p-type substrate 30 has a doped n-well 32 implanted and then thermally diffused into it. The n-well 32 defines the CCD of a vertical shift register. The substrate 30 defines top and bottom surfaces 30a and 30b, respectively. As a result of the careful choice of implant parameters and thermal processing, the uniformly lightly doped n-well 32 is actually provided typically several micrometers below the substrate top surface 30a. As will be understood to those skilled in the art, an additional p-type implant in n-well 32 controls the potential of the barrier regions of each electrode. For a further discussion of such implants, see commonly assigned U.S. Pat. No. 4,908,518 to Losee et al, the disclosure of which is incorporated by reference herein. Polysilicon electrodes 26a and 26b control the barrier and storage regions of vertical CCD 26. Polysilicon electrode 26c control the potential of the overflow charge region located between the CCD channel 26 and LOD 29. It will be understood that although a straightforward LOD structure is shown, other types of LOD structures can also be used in accordance with this invention, including overflow potential control in electrode regions and overflow potential control accomplished by means other than independent electrode 26c.

Figure 2C:
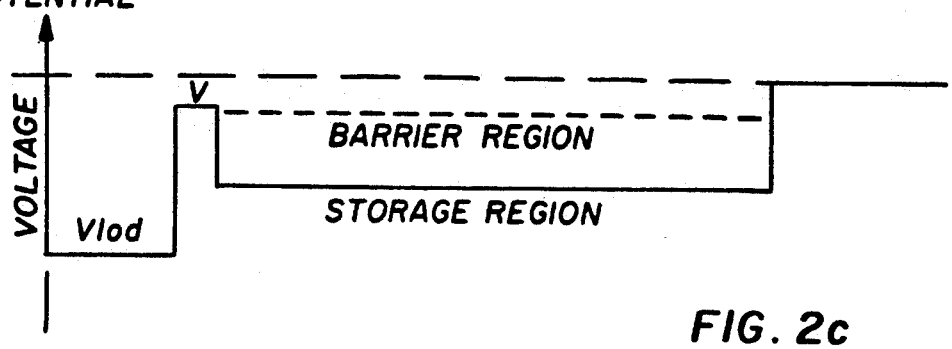
FIG. 2c illustrates the electrostatic potential diagram taken along the line 2A—2A of FIG. 2b of an image sensor in accordance with the invention.

As shown in FIG. 2a, a microprocessor 34 provides a digital signal to a D/A converter which produces a desired overflow gate voltage which is applied to overflow gate electrode 26c. As shown in FIG. 2c, charge is collected in the storage region. The vertical overflow potential $V_{og}$ provides a barrier to charge being delivered to the lateral overflow drain 29. During the time charge is being collected in the storage region, the amount of charge that can be stored is varied to improve exposure latitude. Thereafter, the storage charge is shifted vertically into shift register 27 as previously described.

Figure 3A:
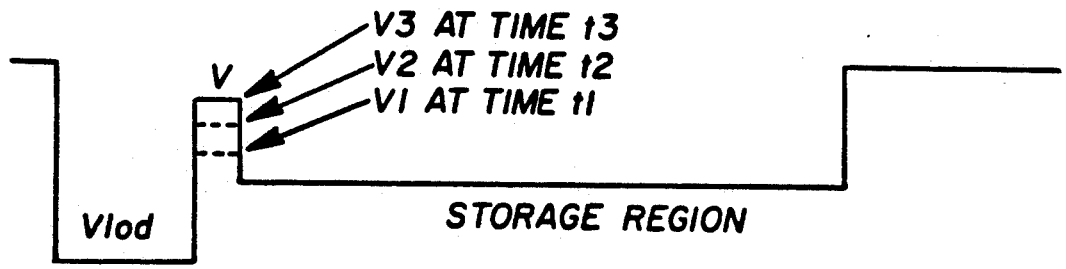
FIG. 3a-c illustrate the electrostatic potential diagram taken along line A—A of FIG. 2b for various values of the antiblooming barrier potential Vog.
Figure 3B:
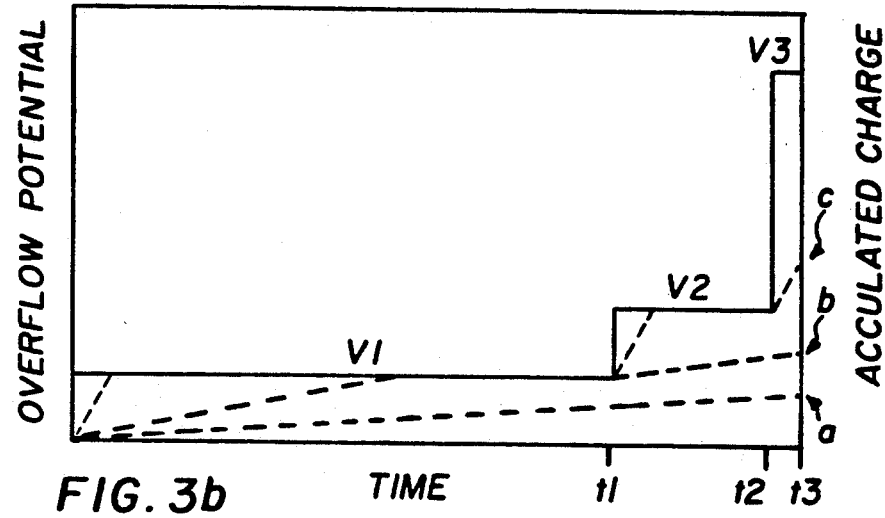

With reference to FIGS. 3a-b the VOD barrier potential is shown at times $t_1$, $t_2$ and $t_3$. At each time (t), the microprocessor 34 causes the overflow potential to increase in a step wise manner from $V_{(n-1)}$ to $V_n$ at time $t_n$. In this specific example, n=3. Initially, at time $t_1$, the overflow barrier $V_1$ is small. Even moderate light intensity (I) rapidly fills the well to overflow, causing accumulation of signal charge to cease. Later, at time $t_2$, the charge required for overflow is increased to overflow potential $V_2$ larger than $V_1$. This again allows the device to accumulate charge without overflow, thereby extending its exposure latitude. For still higher light intensities, the well may again fill with time to the overflow potential $V_2$, and charge accumulation will again cease. No further charge will be accumulated until time $t_3$, when the overflow potential increase to $V_3 > V_2$. The total number of steps in the overflow potential during integration is not critical.

The fraction of time the device spends in overflow at each value of overflow potential depends on the light intensity and on the duration and magnitude of the step change in potential. By tailoring the duration and magnitude of the changes during integration, the device gain, which measures the ratio of the charge accumulated in the well to the charge generated by the incident light, can be caused to change as a function of intensity. This extends the exposure latitude, as will be illustrated. The principle of operation is best explained by graphing the time dependence of the overflow potential applied to electrode 26c together with the time dependence of charge accumulation. This is shown in FIG. 3b for several different light levels. A constant incident intensity for a given pixel flux is assumed during integration, as is usually the case in practice. The dashed lines show the time dependence of charge accumulated in the well; the slope of the dashed lines being proportional to the incident intensity. The solid lines with squares represent the overflow potential, which is increased twice during the integration time $t_3$.

For low-exposure levels, as shown in curve (a) of FIG. 3b, the overflow potential is not exceeded during the exposure time and the total charge accumulated is not reduced by overflow. Thus, low-light level operation is not influenced by the proposed mode of operation. Charge accumulates linearly with time, as shown by the dashed line (a), and the total charge accumulated during integration (given by the intersection of the dashed line with the right hand scale in FIG. 3b) is proportional to the incident intensity. This result is shown graphically in FIG. 3c, region a, which plots the total accumulated charge during integration time $t_3$ as a function of incident intensity.

Figure 3C:
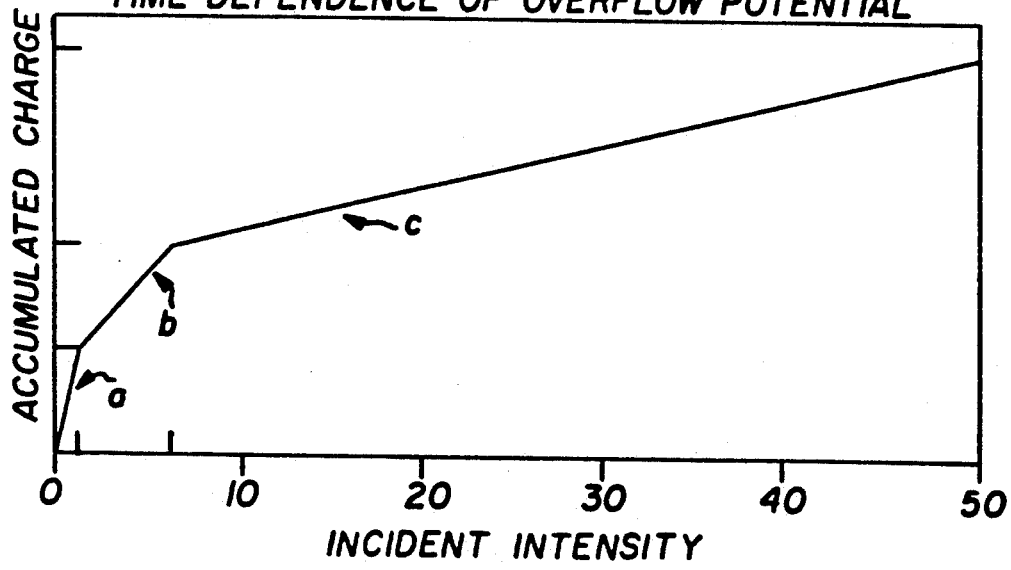

For higher intensities, the accumulated charge may exceed the value required for overflow before time $t_1$. This is the case for light intensity (b) in FIG. 3b. Accumulation of charge in the well temporarily ceases. As shown in FIG. 3b, however, charge again accumulates at the original rate, allowing the device to remain light sensitive. The proportionally constant between accumulated and generated charge will now be less than that for case (a) of low-light level because the device is in overflow for a portion of the integration time. This result is shown in FIG. 3c, region b. The rate of charge accumulation per unit incident intensity is now less than in region a by the ratio $(t_3 - t_1)/t_3$.

For still higher exposure levels, curve (c) of FIG. 3b, the device overflows during interval $t_1$-$t_2$, but again accumulates during interval $t_2$-$t_3$. Again the proportionally constant accumulated and generated charge will be less than for case b because the interval $t_2-t_3$ is short.

As is shown in FIG. 3c, by region c of a line whose slope is less than that of region a by the ratio $(t_3-t_2)/t_3$, $t_1$ to $t_2$ as well as for $t<t_1$.

The stepwise variation $V_1$, $V_2$, $V_3-V_n$ of the overflow potential can be repeated many times. The potential can be a continuous function of time. In general, according to this invention, whenever the time rate of change of the overflow potential is greater than the rate of charge generation due to the incident light, the overflow ceases and the device again continuously accumulates charge in the well.

Figure 4A:
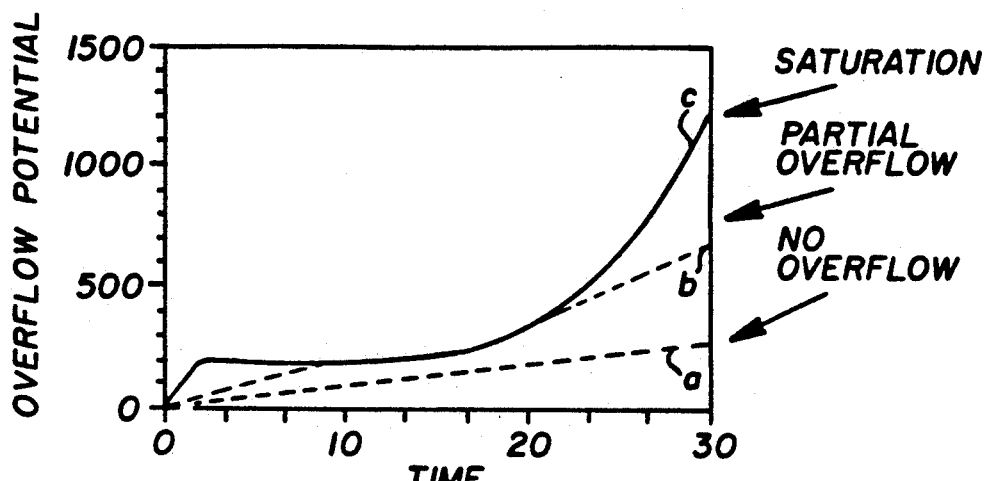

The principle of operation for continuous variation of the overflow barrier potential is best explained by graphing the time dependence of the overflow potential together with the time dependence of charge accumulation. This is shown in FIG. 4a for several different light levels. In this case the output of the D/A converter 36 of FIG. 2a will continuously provide a ramp voltage. A constant intensity for a given pixel flux is assumed during integration, as is usually the case in practice. As in FIG. 3b, the dashed lines correspond to charge accumulated in the well; the slope of the dashed lines is proportional to the incident intensity. The solid curve with squares represents the overflow potential, which is increased continuously during the integration time (t).

For low-exposure levels, as shown in curve (a) of FIG. 4a, the overflow potential is not exceeded during the exposure time and the total charge accumulated is not reduced by overflow. Thus, low-light level operation is not influenced by the proposed mode of operation. Charge accumulates linearly with time, as shown by the dashed line (a), and the total charge accumulated during integration (given by the intersection of the dashed line with the right hand scale in FIG. 4a) is proportional to the incident intensity.

For higher intensities, the accumulated charge may exceed the value required for overflow. This is the case for light intensity (b) in FIG. 4a. Accumulation of charge in the well temporarily ceases. As shown in FIG. 4a, however, as time progresses, the slope of the solid curve increases and comes to exceed the slope of the dashed curve. Charge again accumulates at the original rate, allowing the device to remain light sensitive. However, the proportionally constant between accumulated and generated charge will now be less than that for case (a) of low-light level because the device is in overflow for a portion of the integration time.

For still higher exposure levels, curve (c) of FIG. 4a, the device overflows continuously during integration. The accumulated charge follows the solid curve to its maximum value, and the device output saturates at a point determined by the value of the overflow potential at the end of integration.

Figure 4B:
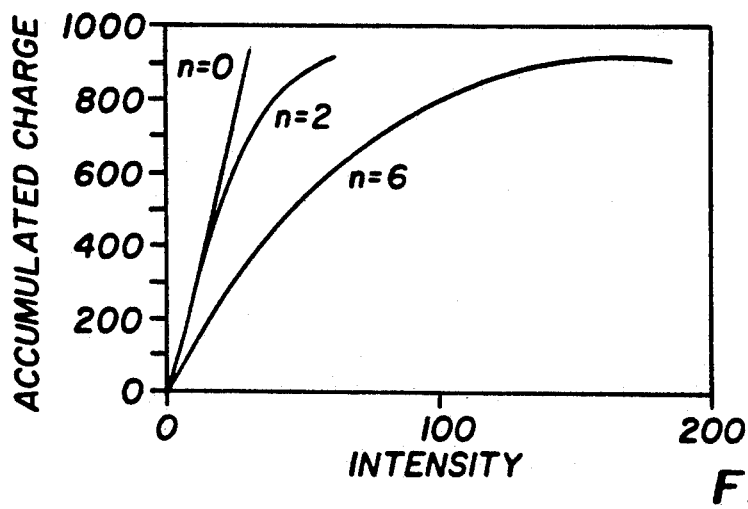
Figure 4C:
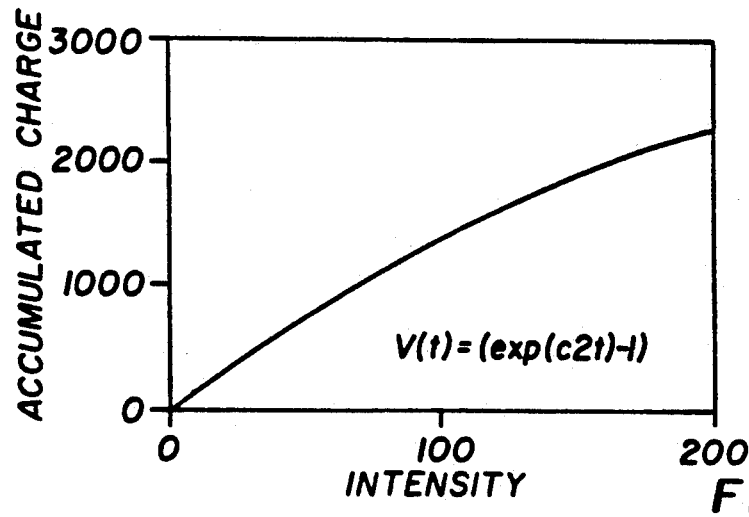

By reading the right hand scale of FIG. 4a, the total charge accumulated in the well at the end of integration is plotted as a function of incident intensity as in FIG. 3c. This has been done in FIG. 4b for an important class of functional forms of the time dependence of the overflow potential. In these examples, the overflow potential has a power law dependence on time such that the overflow potential barrier as computed by the microprocessor 34 varies with time in accordance with the formula $V(t)=C_1+C_2 t^n$ where $C_1$ and $C_2$ are constants and the exponent n characterized the rate that V(t) changes with time. These parameters can be determined experimentally. As shown in FIGS. 4b and 4c, the exposure latitude has been substantially increased from its value for the case of no variation in overflow potential (curve labelled n=o). The device exhibits a smooth reduction of sensitivity (slope in FIG. 4b) with increasing exposure; the shape of this curve having been determined by the time dependence of the overflow potential.

Numerical results are shown in FIG. 4c for exponential variations of the overflow potential in which case the overflow barrier potential changes with time in accordance with the formula $V(t)=C_1+C_2 e^{C_3 t}$ where $C_1$, $C_2$, and $C_3$ are constants. For the power law and exponential time dependence of overflow potential, the resulting device response decreases smoothly. As opposed to the case of stepwise variation. In all cases, large increases in exposure latitude are obtained with no significant sacrifice in low light performance.

Application of this method is by no means limited to the functional forms of the time dependence of the overflow potential given in these illustrative example. However, both the power law and exponential functional forms of the time dependence of the overflow potential closely optimize sensor response to incident light for a variety of system applications. For example, the power law dependencies can be use to tailor the shape of the curve so that system noise is nearly matched to photon shot noise for all exposures. The information handling efficiency of the system is thus maximized. The exponential dependence of V(t) results in a very smooth variation of the response curve which minimizes the effects of fixed-pattern noise due to pixel-to-pixel variations. This is not possible for some previous latitude enhancement schemes.

The invention has been described in detail with particular reference to a certain preferred embodiment thereof, but it will be understood that variations and modifications can be effected within the spirit and scope of the invention.

We claim:

1. In a frame transfer image sensor having a plurality of vertical CCDs each of which includes a CCD channel region having therein photo sensitive elements, and a plurality of electrodes with some of such electrodes allowing incident light to pass therethrough into the channel region which causes charge to be collected in a storage region of the channel region, the improvement comprising:
   (a) a lateral overflow drain including a doped region adjacent to but spaced from the CCD channel region;
   (b) a separate overflow gate electrode disposed between the drain and the channel region for applying an overflow potential between the doped region and the CCD channel region to control charge transfer between the charge storage region and the drain; and
   (c) means for controlling the overflow potential applied only to the overflow gate electrode for varying the charge storage capacity of the storage region during the time charge is being collected to improve exposure latitude.

2. The invention of claim 1 wherein said controlling means includes a microprocessor for producing a signal representing the applied potential.

3. The invention of claim 1 wherein the overflow potential V(t) varies in accordance with the formula: $V(t)=C_1+C_2 t^n$ wherein t is time, $C_1+C_2$ are constants and n characterizes the rate that V(t) changes with time.

* * * * *